US005117938A

United States Patent [19]

Whanhaeng

[11] Patent Number: 5,117,938

[45] Date of Patent: Jun. 2, 1992

[54] SPEAKER INSTALLING HOLDER

[75] Inventor: Jo Whanhaeng, Seoul, Rep. of Korea

[73] Assignee: Samsung Electronics Co., Ltd., Kyunggi-Do, Rep. of Korea

[21] Appl. No.: 622,536

[22] Filed: Dec. 5, 1990

[30] Foreign Application Priority Data

Jul. 11, 1990 [KR] Rep. of Korea .................... 90-10167

[51] Int. Cl.[5] .............................................. H05K 5/00

[52] U.S. Cl. .................................. 181/148; 181/150; 181/153; 181/199

[58] Field of Search ............... 181/148, 150, 153, 198, 181/199, 171, 172

[56] References Cited

U.S. PATENT DOCUMENTS 3,925,626 12/1975 Stallings. Jr. ....................... 181/148

4,359,133 11/1982 Krolak ........ ....................... 181/172

*Primary Examiner*—L. T. Hix
*Assistant Examiner*—Khanh Dang
*Attorney, Agent, or Firm*—Cushman, Darby & Cushman

[57] ABSTRACT

A speaker installing holder comprising the device a fixed plate having at least two hook members upwardly projected at its ends, said hook members being detachably insertable into insertion holes formed on a chassis; a vertical wall vertically extended from the inside of said fixed plate; and an inclined wall inwardly extended from said vertical wall in an inclined manner, all the above parts being integrally formed. A speaker can be installed in a simple manner by placing a speaker into the space of the holder body, and press-fitting the hook members into the insertion holes, with the result that the productivity is improved.

3 Claims, 2 Drawing Sheets

SPEAKER INSTALLING HOLDER

BACKGROUND OF THE INVENTION (1) Field of the Invention

The present invention relates to a speaker installing holder, and particularly to a speaker installing holder which can be detachably attached without using any bolts or nuts when securing the speaker, thereby improving the productivity.

(2) Description of the Prior Art

Generally, a relatively small speaker is installed within audio apparatuses or personal computers. The more the apparatuses are miniaturized, the more the size of such speaker is reduced. If the miniaturized speaker is installed by using bolts and nuts, the bolts and nuts require spaces for accommodating them, which results in that the fastening work becomes difficult, and the speaker becomes liable to be damaged as well, thereby giving adverse effects to regenerating sound.

FIG. 1 illustrates an example of the fixed state of the conventional speaker, and in order to solve the above described problems, a plurality of bent pieces B are formed on proper positions of a chassis A to insert and secure a speaker C. In this state, one side of the speaker C is fastened by means of screws D which are driven by means of a fastening tool such as a screw driver. But in such a case, if the driving force for the screw driver is excessive, the speaker can be damaged, with the result that an adverse effect is given to regenerating the sound, and that the use of the fastening means lowers the productivity as in the case of the preceding devices.

Further, as shown in FIG. 2, a connecting ring E is formed on the chassis, and an elastic member F made of a steel wire is connected to the connecting ring E in a triangular form, so that the elastic member F should press down the speaker C, thereby securing the speaker. However, such a device requires a large installing area, and there is another disadvantage such that a short circuit may be formed if the speaker power line and the elastic member are contacted each other.

SUMMARY OF THE INVENTION

The present invention is intended to overcome the above described disadvantages of the conventional techniques.

Therefore, it is an object of the present invention to provide a speaker installing holder which can be detachably attached without using any fastening tools and fastening means, thereby improving the productivity.

It is another object of the present invention to provide a speaker installing holder in which no damage to the speaker occurs during its installation, and the quality of the regenerated sound is improved after the installation.

In achieving the above object, the device of the present invention comprises: a fixed plate having at least two hook members upwardly projected at its ends, the hook members being detachably attached to the chassis; a vertical wall vertically extended from the inside of the fixed plate; and an inclined wall extended inwardly from the vertical wall in an inclined form, the above mentioned components being formed integrally. Further, the present invention provides a speaker installing holder in which inner protuberances are projected inwardly from said vertical wall in order to hold the speaker. Further, the present invention provides a speaker installing holder in which a wire guide hole and a plurality of through-holes are formed on the inclined wall.

BRIEF DESCRIPTION OF THE DRAWINGS

The above objects and other advantages of the present invention will become more apparent by describing in detail the preferred embodiment of the present invention with reference to the attache drawings in which.

DESCRIPTION OF THE PREFERRED EMBODIMENT

Figure 1:
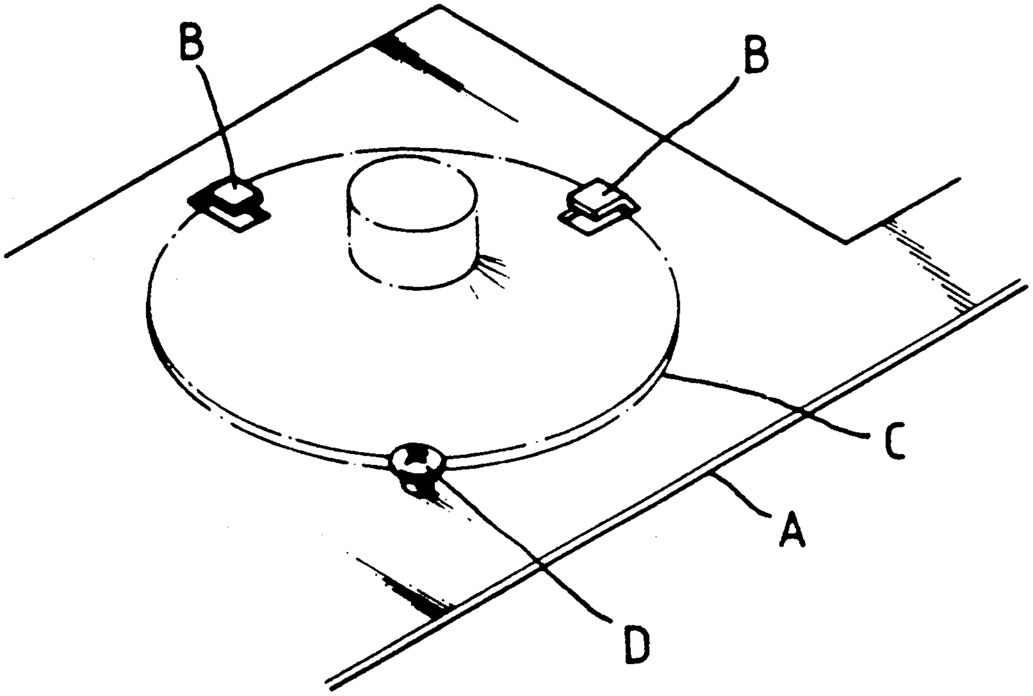
FIG. 1 (PRIOR ART)
FIG. 1 and FIG. 2 are the perspective views of examples of the prior art.
Figure 2:
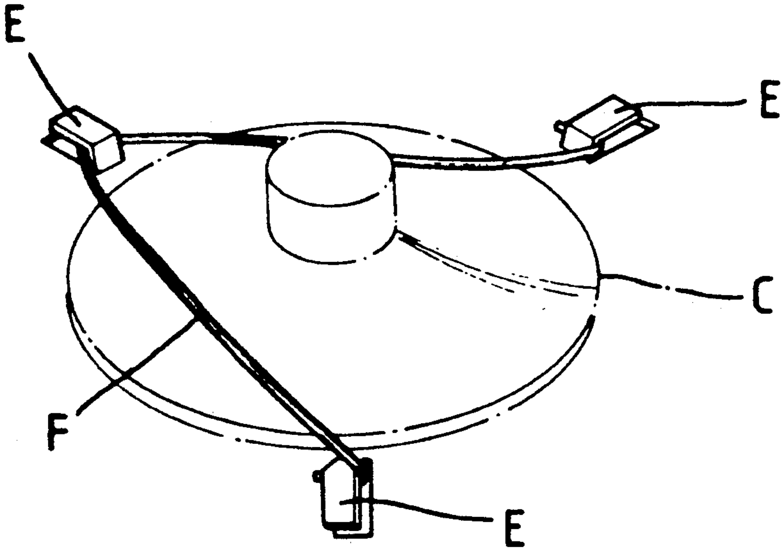
FIG. 2 (PRIOR ART)
Figure 3:
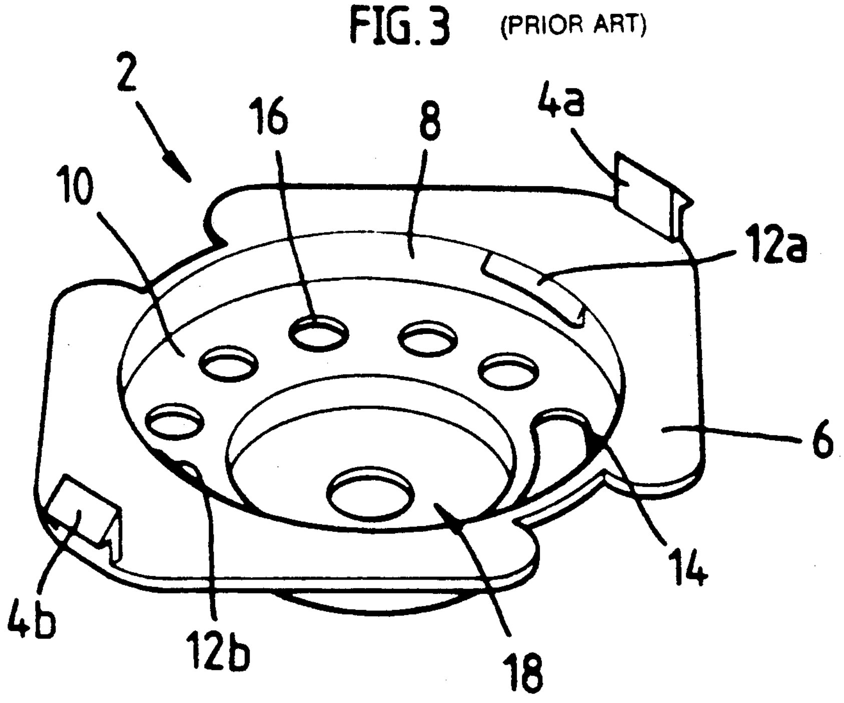
FIG. 3 (PRIOR ART)
FIG. 3 is a perspective view of the speaker installing holder according to the present invention.

As shown in FIG. 3, a holder body 2 is provided with: a fixed plate 6 having hook members 4*a*, 4*b* upwardly projected at opposed ends of the plate, and a speaker receiving cavity 18 formed in the fixed plate for holding a speaker, the cavity comprising a vertical wall 8 vertically extending around peripheral portions of the cavity; and an inclined wall 10 inwardly extending from the vertical wall 8 in an inclined form, wherein the plate, hook members and walls are integrally formed. Inner protuberances 12*a*, 12*b* are projected inwardly from the inside of the vertical wall 8, the inner protuberances 12*a*, 12*b* and the hook members being positioned on the same straight line. However, the inner protuberances 12*a*, 12*b* and the hook members 4*a*, 4*b* may be positioned in rectangularly crossing directions, and at least two of them should be desirably formed.

A wire guide hole 14 is formed on one portion of the inclined wall 10, and a plurality of through-holes 16 are formed on another portion of the inclined wall 10. Further, speaker cavity 18 for holding the speaker is formed within the holder body 2.

Figure 4:
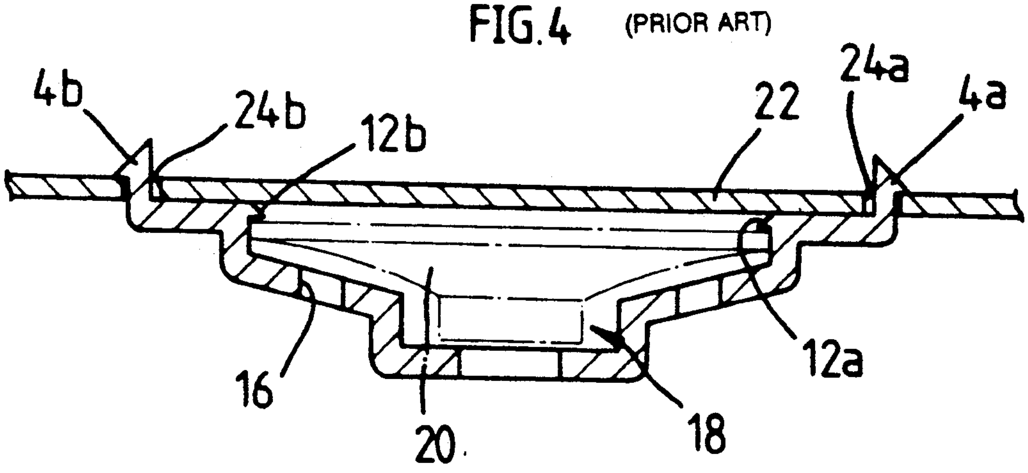
FIG. 4 (PRIOR ART)
FIG. 4 is a sectional view of the assembled state of the speaker installing holder according to the present invention.

The speaker installing holder constituted as described above can be installed in such a manner that: as shown in FIG. 4, a speaker 20 is placed into the speaker cavity 18 of the holder body 2 by press-fitting through the inner protuberances 12*a*, 12*b*; and the hook members 4*a*, 4*b* are inserted into insertion holes 24*a*, 24*b* on a chassis 22. By being held by the inner protuberances 12*a*, 12*b*, the speaker 20 is secured within the speaker cavity 18 without the possibility of detachment.

Under this condition, if the holder body 2 needs to be detached due to the replacement of the speaker 20 and the like, pressure may be applied to just the hook members 4*a*, 4*b* in the inward direction. Then the holder body 2 can be detached from the insertion holes 24*a*, 24*b* of the chassis 22, thereby rendering the speaker 20 detachable.

As described above, the speaker installing holder according to the present invention can install the speaker in such a simple manner that the speaker is placed into the cavity of the holder body, and then the hook members is press-fitted into the insertion holes. Thus, the installation of the speaker can be carried out without using any fastening tools or fastening means, with the result that the productivity is improved. Further, the deflect rate can be reduced because the damages of speakers due to the applying of undue forces to the fastening means can be prevented. There is another advantage that speakers can be replaced in an easy manner.

What is claimed is:

1. A speaker installing holder adapted to secure a speaker to the face of a chassis in the direction of sound propagation, said chassis having insertion holes and said speaker having a front section for facing an inside wall of said chassis and a rear section for being supported by said holder, said holder comprising: a fixed plate having at least upwardly projecting two hook members located at opposed end of said plate, said hook members being detachably insertable into said insertion holes of said chassis; and a speaker receiving cavity formed in said fixed plate for supporting the rear section of the speaker, wherein said cavity comprises a vertical wall vertically extending around peripheral portions of said cavity and an inclined wall extending inwardly from said vertical wall in an inclined manner, said plate, hook members, vertical wall and inclined wall being integrally formed.

2. The speaker installing holder as claimed in claim 1, wherein said vertical wall is provided with at least two inner protuberances inwardly extended therefrom.

3. The speaker installing holder as claimed in claim 1 wherein said inclined wall is provided with a wire guide hole and a plurality of through-holes.

* * * * *